(12) United States Patent
Erwin et al.

(10) Patent No.: US 9,343,420 B2
(45) Date of Patent: May 17, 2016

(54) UNIVERSAL SOLDER JOINTS FOR 3D PACKAGING

(71) Applicant: GLOBALFOUNDRIES INC., Grand Cayman (KY)

(72) Inventors: Brian M. Erwin, Lagrangeville, NY (US); Eric D. Perfecto, Poughkeepsie, NY (US); Nicholas A. Polomoff, White Plains, NY (US); Jae-Woong Nah, Closter, NJ (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/181,616

(22) Filed: Feb. 14, 2014

(65) Prior Publication Data

US 2015/0235979 A1    Aug. 20, 2015

(51) Int. Cl.
*H01L 23/16* (2006.01)
*H01L 23/00* (2006.01)
*H01L 21/56* (2006.01)

(52) U.S. Cl.
CPC ............... *H01L 24/17* (2013.01); *H01L 21/563* (2013.01); *H01L 24/11* (2013.01); *H01L 24/81* (2013.01); *H01L 2924/12042* (2013.01)

(58) Field of Classification Search
CPC ........... H01L 2224/81801; H01L 2224/16225; H01L 2224/11001; H01L 2224/1314; H01L 21/00
USPC ............ 257/737, E21.499, E23.068; 438/108
See application file for complete search history.

(56) References Cited

U.S. PATENT DOCUMENTS

| | | |
|---|---|---|
| 5,074,947 A | 12/1991 | Estes |
| 7,523,852 B2 | 4/2009 | Buchwalter |
| 7,829,380 B2 | 11/2010 | Irsigler |
| 7,931,187 B2 | 4/2011 | Gruber |
| 8,053,283 B2 | 11/2011 | Gruber |
| 8,138,020 B2 | 3/2012 | Gruber |
| 8,293,587 B2 | 10/2012 | Jadhav |
| 8,368,213 B2 | 2/2013 | Lee |
| 8,373,275 B2 | 2/2013 | Daubenspeck |
| 8,381,965 B2 | 2/2013 | Jang |

(Continued)

FOREIGN PATENT DOCUMENTS

| | | |
|---|---|---|
| WO | WO9109419 | 6/1991 |
| WO | WO2013012139 | 1/2013 |

OTHER PUBLICATIONS

Jae-Woong Nah et al., Development of Wafer Level Underfill Materials and Assembly Processes for Fine Pitch Pb-free Solder Flip Chip Packaging, 2011 Electronic Components and Technology Conference, 1015-1022.

(Continued)

*Primary Examiner* — Evan Pert
*Assistant Examiner* — Changhyun Yi
(74) *Attorney, Agent, or Firm* — Yuanmin Cai; Andrew M. Calderon; Roberts, Mlotkowski, Safran & Cole PC

(57) ABSTRACT

Electronic devices including solder bumps embedded in a pre-applied coating of underfill material and/or solder resist are fabricated, thereby improving chip-package interaction reliability. Underfill can be directly applied to a wafer, enabling increased filler loadings. Passages formed in the underfill and/or solder resist coating expose electrically conductive pads or metal pillars. Such passages can be filled with molten solder to form the solder bumps.

12 Claims, 11 Drawing Sheets

(56) References Cited

U.S. PATENT DOCUMENTS

| | | |
|---|---|---|
| 8,381,966 B2 | 2/2013 | Kumar |
| 8,405,199 B2 | 3/2013 | Lu |
| 8,441,124 B2 | 5/2013 | Wu |
| 8,492,262 B2 | 7/2013 | Gruber |
| 2007/0184579 A1 | 8/2007 | Huang |
| 2012/0273945 A1 | 11/2012 | Chang |
| 2012/0305633 A1 | 12/2012 | Feger |
| 2013/0015576 A1 | 1/2013 | Lin |
| 2013/0062757 A1 | 3/2013 | Feger |
| 2013/0270695 A1* | 10/2013 | Raj et al. ................. 257/737 |

OTHER PUBLICATIONS

Katsuyuki Sakuma et al., Differential Heating/Cooling Chip Joining Method to Prevent Chip Package INteraction Issue in Large Die with Ultra Low-k Technology, IEEE 2012, pp. 430-435.

* cited by examiner

UNIVERSAL SOLDER JOINTS FOR 3D PACKAGING

FIELD

The present disclosure relates to the physical sciences and, more particularly, to electronic structures including solder elements for creating electrical connections and methods of fabrication thereof.

BACKGROUND

Electrical connections can be formed using microbumps in three dimensional (3D) packaging via flip chip assembly processes. The highly accurate alignment of structures to be electrically connected by microbumps is generally required, necessitating the use of expensive bonding tools and possibly reducing throughput.

SUMMARY

A method provided in accordance with the principles described herein includes obtaining a structure including a wafer and a plurality of metal contact structures mounted to the wafer, each of the metal contact structures having a top surface. A coating comprising at least one of underfill material and solder resist is deposited on the wafer, thereby encapsulating the metal contact structures. The coating on the wafer is then cured. The method further includes forming a plurality of passages through the coating such that a plurality of portions of the top surface of each metal contact structure are exposed, respectively, by a plurality of the passages and filling each of the passages with molten solder, the molten solder forming solder structures contacting the exposed portions of the top surfaces of each metal contact structure.

A further method includes providing a first electronic device including a plurality of metal pillars, providing a second electronic device including a plurality of electrically conductive contact pads, one of the first and second electronic devices including a cured coating comprising at least one of underfill material and solder resist, a plurality of passages extending through the coating, and a plurality of solder structures, each of the solder structures filling one of the passages, the heights of the metal pillars being at least equal to the heights of the solder structures. The method further includes causing the first electronic device to contact the second electronic device such that the metal pillars are in opposing relation to the electrically conductive pads and a plurality of the solder structures extend between each metal pillar and each electrically conductive pad and bonding the first electronic device and the second electronic device such that each of the metal pillars is electrically connected to one of the opposing electrically conductive pads by a plurality of solder structures.

An electronic device provided in accordance with the principles described herein includes a wafer, a plurality of metal pillars mounted to the wafer, each of the metal pillars having a top surface, a coating on the wafer and encapsulating the metal pillars, the coating having a contact surface and comprising underfill material, and a plurality of passages extending within the coating from the contact surface thereof to the top surfaces of the metal pillars, each of the passages being filled with solder structures, the height of each metal pillar being at least equal to the height of each solder structure in contact therewith, the top surface of each metal pillar contacting a plurality of the solder structures, each of the solder structures including an exposed end portion.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Wafers and chip structures and fabrication methods as disclosed herein can provide substantial beneficial technical effects. For example, one or more embodiments may provide one or more of the following advantages:

Reduced chip-package interaction (CPI) stresses;
Improved heat transfer near heat-producing integrated circuits (ICs);
Facilitates use of a wide variety of solder materials;
Facilitates increased filler loadings in underfill materials;
Obviates necessity of high accuracy alignment;
Prevention of voiding within underfill coating between electronic devices;
Facilitates fine pitch applications without bump bridging, allowing larger numbers of inputs/outputs (I/Os) in a given chip size or smaller chip size for given I/O numbers.

These and other features and advantages will become apparent from the following detailed description of illustrative embodiments thereof, which is to be read in connection with the accompanying drawings.

DETAILED DESCRIPTION

Methods are disclosed herein for embedding ultra-fine pitch (1-30 μm) solder bumps in pre-applied underfill. The bumps are employed to create universal solder joints that provide electrical connections to, for example, copper pillars without the use of high accuracy alignment and bonding processes. The avoidance of such processes reduces assembly time and cost. Exemplary structures amenable to flip chip assembly processing, such as chips and wafers including integrated circuits, are also disclosed.

Figure 1A:
FIGS. 1A-I show a flow diagram of steps employed in an exemplary fabrication process.

Steps performed in an exemplary fabrication method are shown in FIGS. 1A-1I. A wafer 20 including an electrically conductive seed layer 22 is shown in FIG. 1A. In some embodiments, the wafer further includes a passivation layer and rows of electrically conductive I/O pads (not shown), the seed layer being electrically connected to the I/O pads. An electronic device layer(s) 24 such as an integrated circuit(s) is incorporated in one or more embodiments and shown schematically in the figures. The wafer may be comprised of silicon, glass or other suitable composition. I/O pads are typically made from an electrically conductive material such as copper or aluminum. The thin, electrically conductive seed layer 22 is deposited on the wafer as shown in FIG. 1A, forming an electrical connection with the underlying device layer 24. The seed layer is comprised of a suitable metal(s) such as copper or TiCu. Seed layer deposition techniques are familiar to those skilled in the art.

Figure 1B:
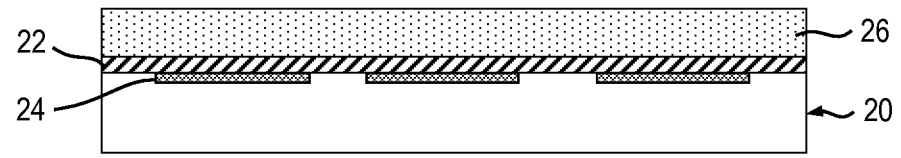
Figure 1C:
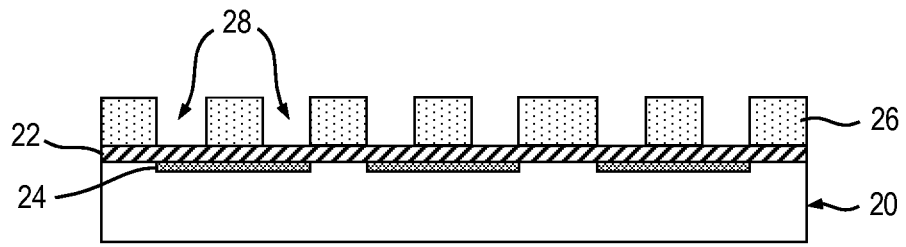

A photoresist layer 26 is applied to the seed layer 22 as schematically illustrated in FIG. 1B. The photoresist layer 26 may be applied as a coating or by laminating a dry film using heat and pressure. Photoresist (PR) deposition and dry film lamination are techniques known in the art for providing such a layer. The photoresist layer 26 has a thickness between 1-200 μm in one or more embodiments, and more preferably between 5-50 μm. The layer is patterned in the step shown in FIG. 1C by subjecting the photoresist layer to light through a mask (not shown) and removing developed or undeveloped photoresist, depending on the type of photoresist employed. If a laminated film is employed, a protective layer (not shown) above the photoresist is removed shortly before photoresist development. Selected portions of the photoresist above the seed layer 22, following etching and washing, is removed. A plurality of vertical channels 28 are accordingly formed, each having a height corresponding to the thickness of the PR layer 26. Because the photoresist layer has a substantially uniform thickness over the entire wafer, the channels 28 have a substantially uniform height. The channels 28 are formed over I/O pads (not shown) formed on the wafer 20 in embodiments where such pads are employed.

Figure 1D:
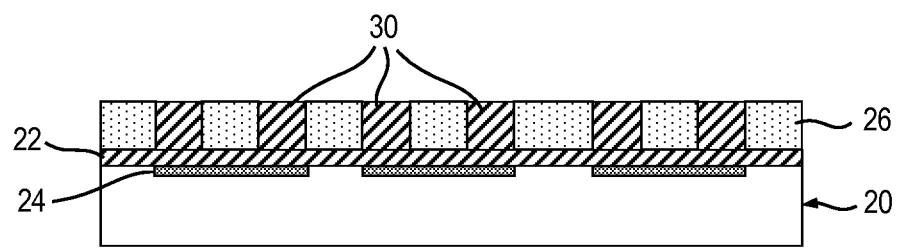
Figure 1E:
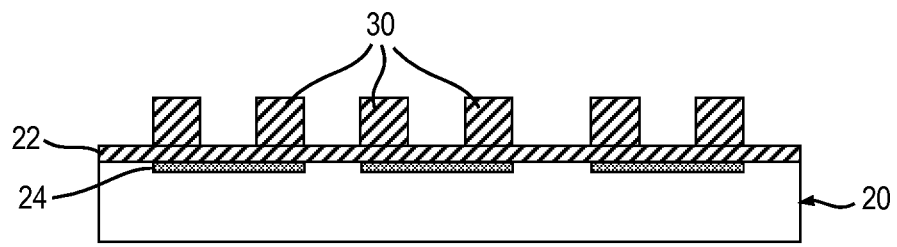
Figure 1F:
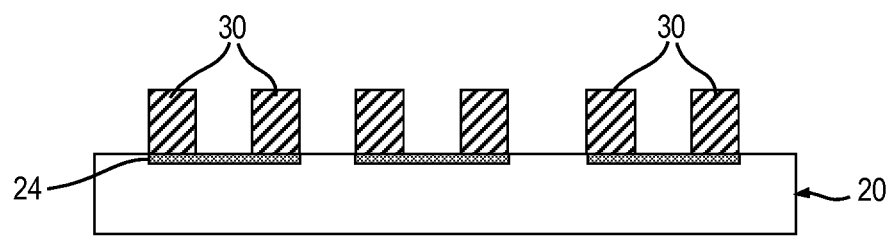

As shown in FIG. 1D, a metal such as, though not necessarily copper, is deposited over the seed layer 22 by electroplating, forming metal pillars 30 as surface contact structures on the wafer. Electroplating is the preferred form of copper deposition for forming pillars of sufficient height, particularly for fine pitch applications. The deposition of copper paste is an alternative to electroplating. The pillars are ideally substantially uniform in height, for example between about 5-60 μm, and are substantially pure copper in some embodiments. In practice, however, the heights of the metal pillars may not be uniform. A twenty percent variation of pillar height in a chip is possible. The photoresist layer 26 is stripped (etched) away, followed by etching of the seed layer as shown in FIGS. 1E and 1F, respectively. The metal pillars 30 are cylindrical in one or more embodiments. Pillars having rectangular, hexagonal or other cross sections are also feasible. The metal pillars have a substantially higher melting point than the melting point of solder materials used in electronic devices as disclosed herein. The device layer 24 is electrically connected to the metal pillars 30 via the seed layer 22.

Figure 1G:
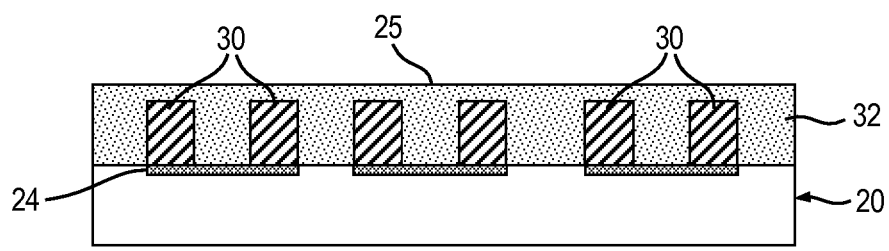

An underfill coating 32 is applied to the structure obtained following the fabrication step shown in FIG. 1F, thereby obtaining the structure shown schematically in FIG. 1G. A variety of thermosetting polymers such as epoxy materials are conventionally employed with silica fillers as underfill materials. The underfill materials can be applied by methods such as spin coating, screen printing, spraying, or lamination of a film. The direct application of underfill to the wafer enables the use of increased filler loadings that would otherwise hinder underfill spreading. Silica, alumina, graphene, graphene oxide, graphite, and boron nitride are among the filler materials that can be employed. Common capillary underfill has about sixty percent (60%) by weight of silica filler. Greater filler loadings between 60-90% may be employed in one or more embodiments described herein. Increased loadings in the underfill improve CPI reliability and improve heat transfer near heat-producing ICs within the wafer 20 or chips formed therefrom. Moreover, typical CPI stresses formed during subsequent bonding operations are minimized by applying and curing the underfill coating 32 before assembly. Curing of the underfill coating follows its application to the wafer substrate and can be conducted in an oven in accordance with conventional processing techniques. Convection ovens are employed for curing the underfill coating 32 in some embodiments. Once cured, the underfill coating 32 is planarized to provide a planar top surface 25 as shown in FIG. 1G. CMP (chemical mechanical polishing), wet blasting, chemical etching, dry etching, and cutting with a dicing saw are among the techniques that may be employed for planarization. The metal pillars 30 remain completely encapsulated by the underfill coating 32 following both deposition and planarization.

Figure 1H:
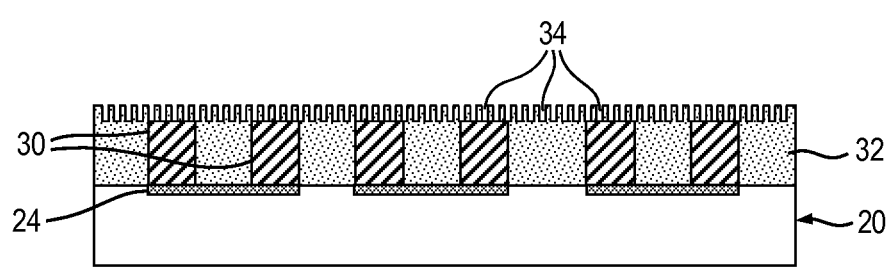

Laser drilling through the underfill coating layer 32 causes the formation of area-arrays of vertical passages 34 within the layer down to the top surfaces of the metal pillars 30. In some embodiments, the passages 34 are formed in parallel rows. As shown in FIG. 1H, some of the passages expose the top surfaces of the metal pillars. As discussed further below, the passages have substantially smaller dimensions than those of the pillars. The distance between passages is also substantially less than the distance between pillars. Multiple parallel passages accordingly intersect each pillar, as discussed further below with respect to FIG. 3.

Figure 1I:
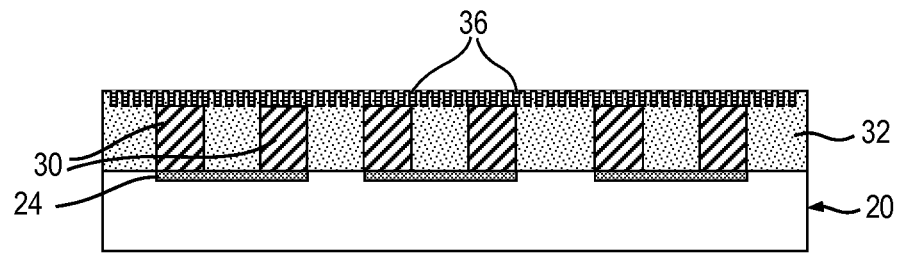

The passages 34 formed within the underfill coating layer 32 are filled with solder. In one or more embodiments, each passage is injected with molten solder by a fill head (not shown) that traverses the wafer. Rows of passages 34 can be filled simultaneously. The passages are filled completely to the tops with the molten solder, thereby ensuring uniformity of height of the resulting copper/solder structures. No solder flux is required nor is any employed in one or more embodiments. The absence of flux prevents volume shrinkage. The molten solder is directly injected into the channels in a low oxygen environment, preferably less than 10,000 ppm in a nitrogen environment. Alternatively, a forming gas environment including nitrogen and hydrogen may be employed (e.g. 90% $N_2$, 10% $H_2$). The solder solidifies as shown in FIG. 1I, also in a low oxygen environment, forming solder structures 36 also known as solder bumps. The bumps preferably extend over the tops of the channels as shown. Some of the solder structures 36 contact the metal pillars 30 while others are formed between the metal pillars. The metal pillars 30 remain solid during solder injection due to their relatively high melting points. The injection of molten solder into cavities is familiar to those of skill in the art. Commonly assigned U.S. Pat. No. 8,492,262 entitled "Direct IMS (Injection Molded Solder) Without a Mask for Forming Solder Bumps on Substrates" and U.S. Pat. No. 7,931,187 entitled "Injection Molded Solder Method for Forming Solder Bumps on Substrates" are expressly incorporated herein by reference.

One or more embodiments of the invention may employ almost any kind of solder, including ternary and quaternary solder compositions. Eutectic SnPb and Pb-free solder (for example, pure Sn, SnAg, SnCu, SnBi, SnIn, SnAu, SnAgCu, InSnBi, or SnAgCuZn) are non-limiting examples of suitable solders. When the solder is injected into the passages 34, the temperature of solder is above its melting temperature but below the melting temperature of the metal pillars. The oxygen concentration in the nitrogen environment is preferably less than 10,000 ppm. The nitrogen does not have to be perfectly pure and the forming gas does not have to have the exact composition as described elsewhere herein. The solder is cooled in a timely manner to minimize or prevent degradation of the underfill material. The environment in which IMS and solder solidification occurs allows formation of structures such as shown in FIGS. 1I and 3, respectively, in one or more exemplary embodiments.

Figure 3:
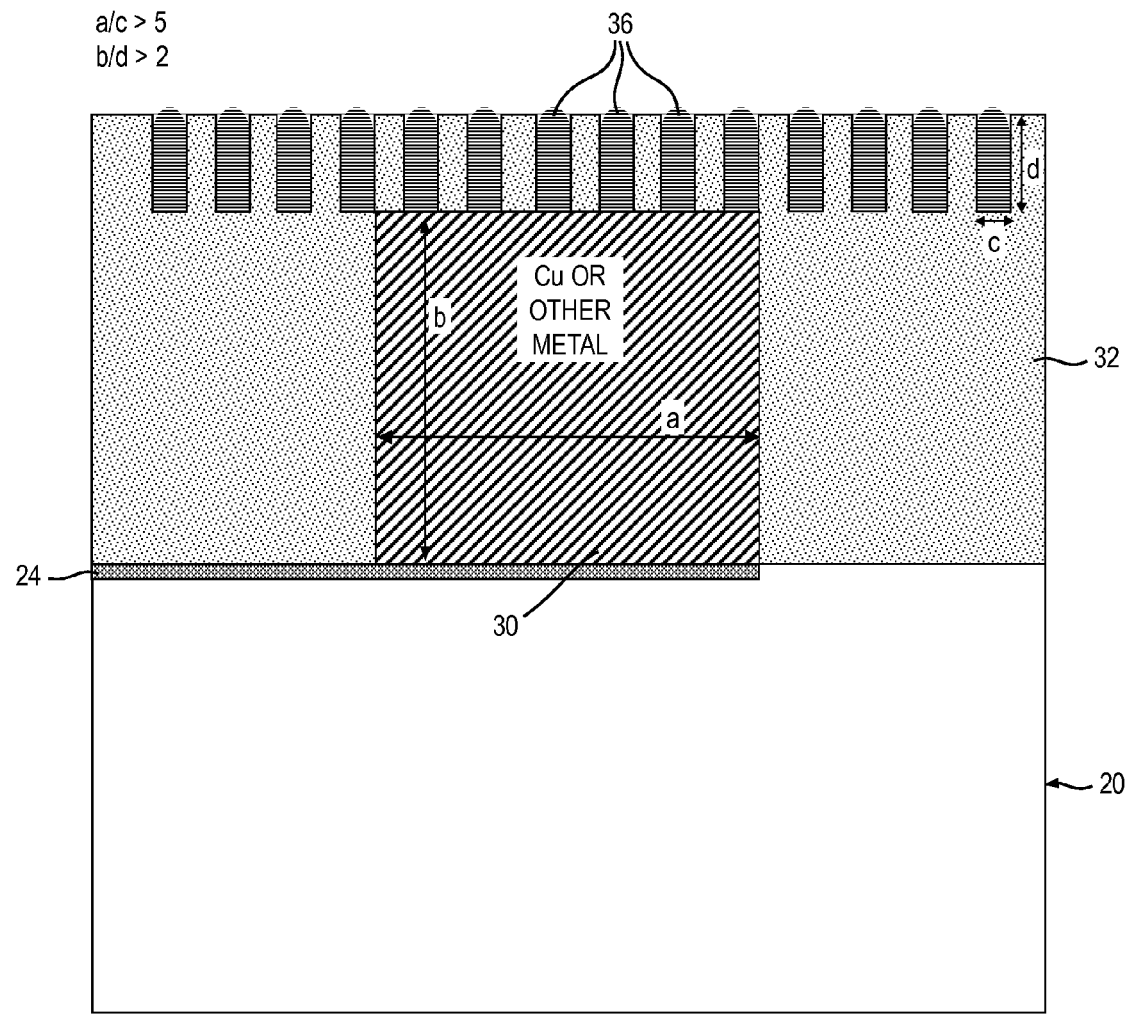
FIG. 3 is an enlarged, sectional view of an electronic structure shown in FIG. 1I.

FIG. 3 provides a greatly enlarged illustration of a portion of the structure shown in FIG. 1I and exemplary relative dimensions. In exemplary embodiments wherein both the metal pillars 30 and solder structures are substantially cylindrical, the diameters "a" of the metal pillars 30 exceed the diameters "c" of the solder structures 36 by at least 5:1. Pillar diameters may range from 0.5 µm to 100 µm while bump (solder structure) diameters may range from 0.1-20 µm. The surface areas of the top surfaces of the metal pillars 30 greatly exceed the contact areas between the metal pillars 30 and the solder structures regardless of pillar configuration, allowing the top surface of each metal pillar to contact a large number of solder bumps. In one or more exemplary embodiments, the surface area of each pillar 30 exceeds the contact area of each solder bump by at least 25:1. The heights "b" of the pillars exceed the heights "d" of the solder bumps (solder structures 36) in one or more embodiments, and by at least 2:1 for one or more exemplary cylindrical and non-cylindrical structures, though ratios as low as 1:1 could be feasible in some applications where the metal pillars 30 are less than ten microns in height. A ratio of pillar height to solder structure height between 1:1 and 2:1 is practical in embodiments where the pillar height is between 10-20 µm. The tops of the bumps form round surfaces due to surface tension of the solder and extend slightly above the top surface of the underfill layer. Multiple electrical connections to each pillar 30 are accordingly formed by the solder bumps 36. In one or more embodiments, at least ten solder bumps are fully formed on each metal pillar. Additional solder bumps may partially contact the top surfaces of the pillars in addition to those in full contact therewith.

Figure 2F:
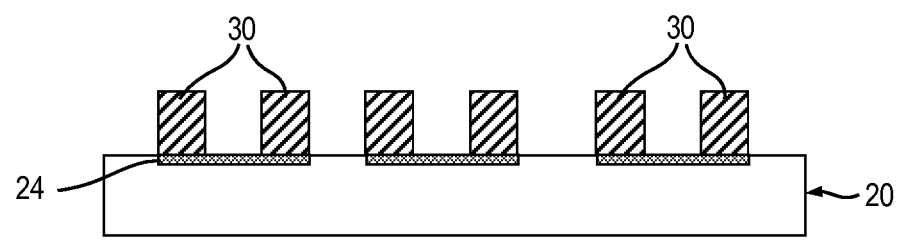
FIGS. 2F-J show a flow diagram of steps employed in an alternative exemplary fabrication process.
Figure 2G:
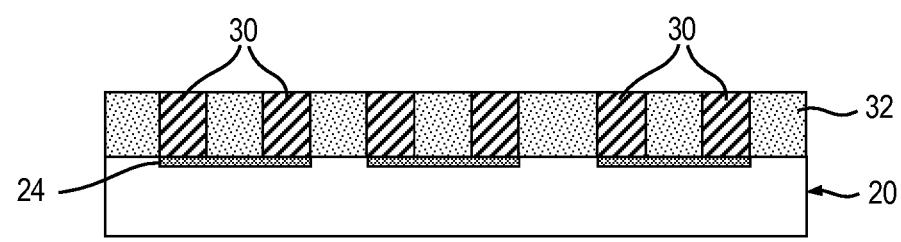
Figure 2H:
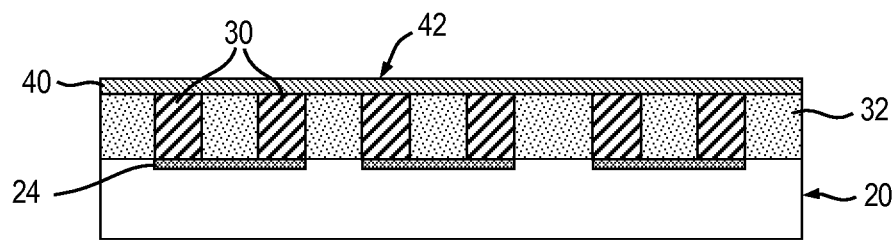

An alternative exemplary process is shown in FIGS. 2F-2J. The structure shown in FIG. 1F is identical to that shown in FIG. 2F and can be fabricated in the same way. Referring to FIG. 2G, an underfill coating 32 is applied to the wafer 20 and cured as discussed above. The underfill coating is then planarized as discussed above, removing sufficient material to expose the top surfaces of the metal pillars 30. In contrast, the metal pillars remain encapsulated following planarization in the method described with respect to FIGS. 1A-1I. A polymer coating 40 is deposited on the structure obtained following the step described with respect to FIG. 2G. The polymer coating 40 includes a low filler content or no filler in some embodiments. The polymer coating may comprise the same polymer compound(s) found in the underfill coating layer 32 or different compound(s). The polymer coating is cured to provide a planar top surface 42 as shown in FIG. 2H. The thickness of the planarized polymer coating layer is engineered to correspond to the desired heights of the later-formed solder bumps. In some embodiments, a photosensitive material is employed to form the polymer coating 40. In other embodiments, solder resist material is employed to form the polymer coating 40.

Figure 2I:
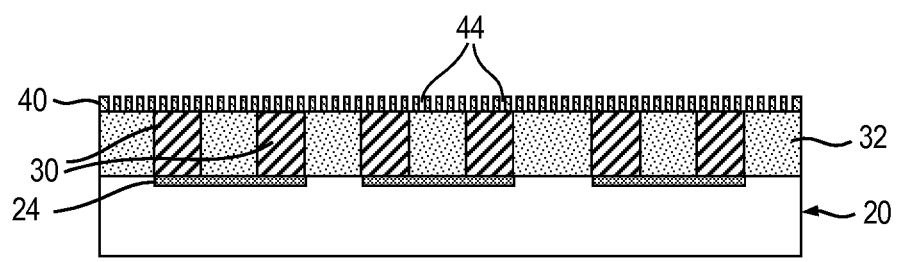

As shown in FIG. 2I, laser drilling is employed to form area arrays of passages 44 that extend through the polymer coating 40. Some of the passages 44 expose the top surfaces of the metal pillars 30. As discussed further below, the passages have substantially smaller dimensions than those of the pillars. The distance between passages is also substantially less than those between metal pillars. Multiple passages accordingly intersect each pillar, exposing multiple portions of each pillar top surface. In embodiments wherein the polymer coating 40 is photosensitive, the coating is patterned and a TMAH-based (tetramethylammonium hydroxide) developer is employed to form the passages 44.

Figure 2J:
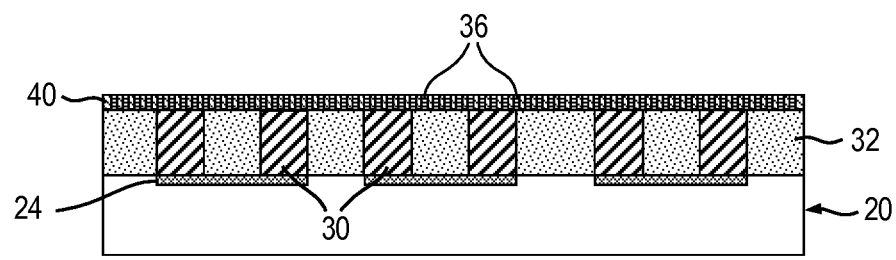

The passages 44 formed within the polymer coating layer 40 are filled with solder. Each passage is injected with molten solder by a fill head (not shown) that traverses the wafer. The passages are filled completely to the tops with the molten solder as described above with respect to FIGS. 1A-1I, thereby ensuring uniformity of height of the resulting metal/solder structure. The molten solder is allowed to harden, forming the structure including solder structures 36 as shown in FIG. 2J. The wafer can be diced to obtain individual chips in some embodiments.

Figure 4:
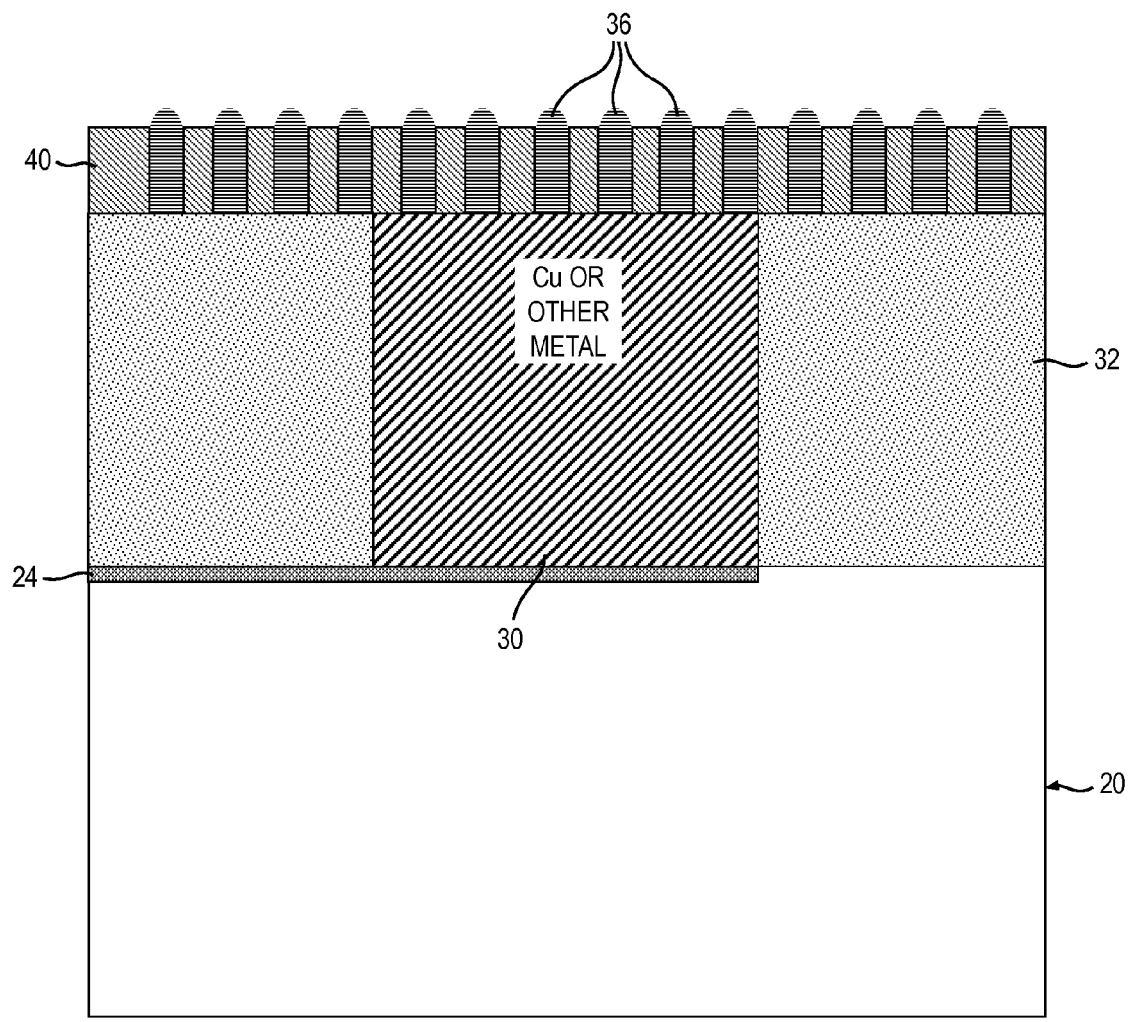
FIG. 4 is an enlarged, sectional view of an electronic structure shown in FIG. 2J.

FIG. 4 provides a greatly enlarged illustration of a portion of the structure shown in FIG. 2J. The exemplary relative dimensions discussed above with respect to FIG. 3 also apply to the embodiment of FIG. 4. The tops of the bumps form round surfaces due to surface tension of the solder and extend slightly above the top surface of the polymer layer. Multiple electrical connections to each pillar 30 are accordingly formed by the solder bumps 36. The employment of a multilayer underfill coating as disclosed facilitates laser drilling. Such drilling is more easily conducted through an underfill layer having low filler loading or without filler. As discussed above, relatively high filler loading is often beneficial for various reasons, particularly in proximity to heat-generating integrated circuits that may be present in an electronic device. The present approach provides the benefits of high filler loading where it is most beneficial while allowing efficient laser drilling to provide the passages 44 for later solder deposition. The excimer ablation process may be employed for ablating/removing underfill whether or not it includes filler. While organic filler would have little impact on ablation, inorganic filler can impact the ablation process. In the case of inorganic filler, the filler can inhibit effective ablation if the underfill particles become too large, too agglomerated, or if the loading becomes too high. If filler is employed, particles should be smaller than the features being ablated. Inorganic particles that are too large could impact the correct formation of structures whereby the entire particle is removed (leaving a crater in the underfill) or the entire particle remains in place, blocking a portion of the ablated via. Factors such as flocculation and/or high particle loading favorably can increase the ablation rate so long as sufficient fluence is applied. If agglomeration or particle loading occurs in such a manner as to exclude organic material between particles, ablation could be halted.

Figure 5:
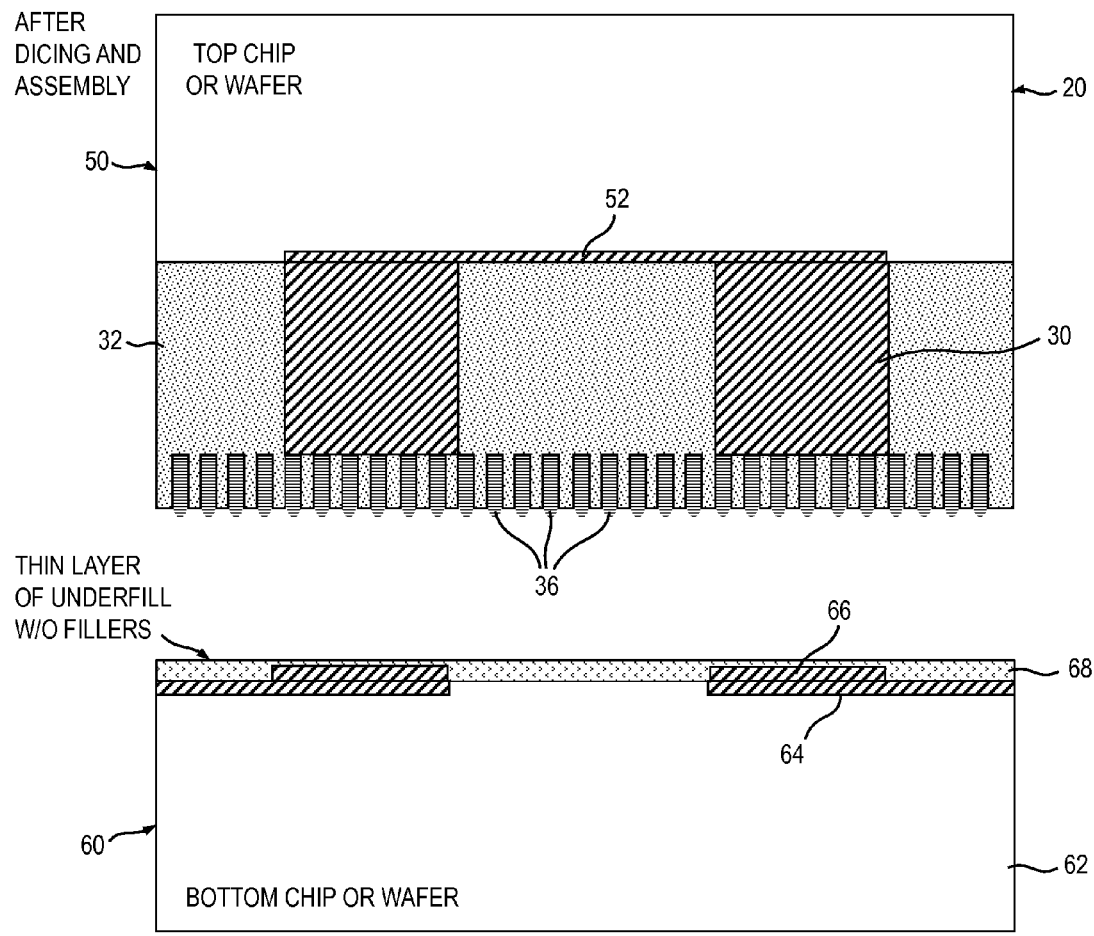
FIG. 5 is an enlarged, sectional view showing the rough alignment of two electronic structures.

FIG. 5 schematically illustrates the rough alignment of a top electronic device 50, which may be either a chip or wafer, with a bottom electronic device 60 that also may be a chip or wafer. In one or more exemplary embodiments, either or both devices 50, 60 comprise one or more integrated circuits. The top device 50 is formed substantially as described above with respect to FIGS. 1A-I and 3. The device 50 includes mostly the same elements as shown in FIG. 3; the same reference numbers are employed to designate similar elements found in both FIGS. 3 and 5. The device 50 further includes a metal layer 52 connecting two metal pillars 30. The metal layer 52 is formed during BEOL (back end of line) processing familiar to those of skill in the art. The bottom device 60 includes a base 62, a metal layer 64, electrically conductive contact pads 66, and a thin layer 68 of underfill material. The underfill material in the thin layer 68 does not include fillers. It overlies the exposed portions of the base 62, the metal layer 64, and the contact pads 66. As shown in FIG. 5, the metal pillars 30 are not perfectly aligned with the contact pads 66.

Figure 6:
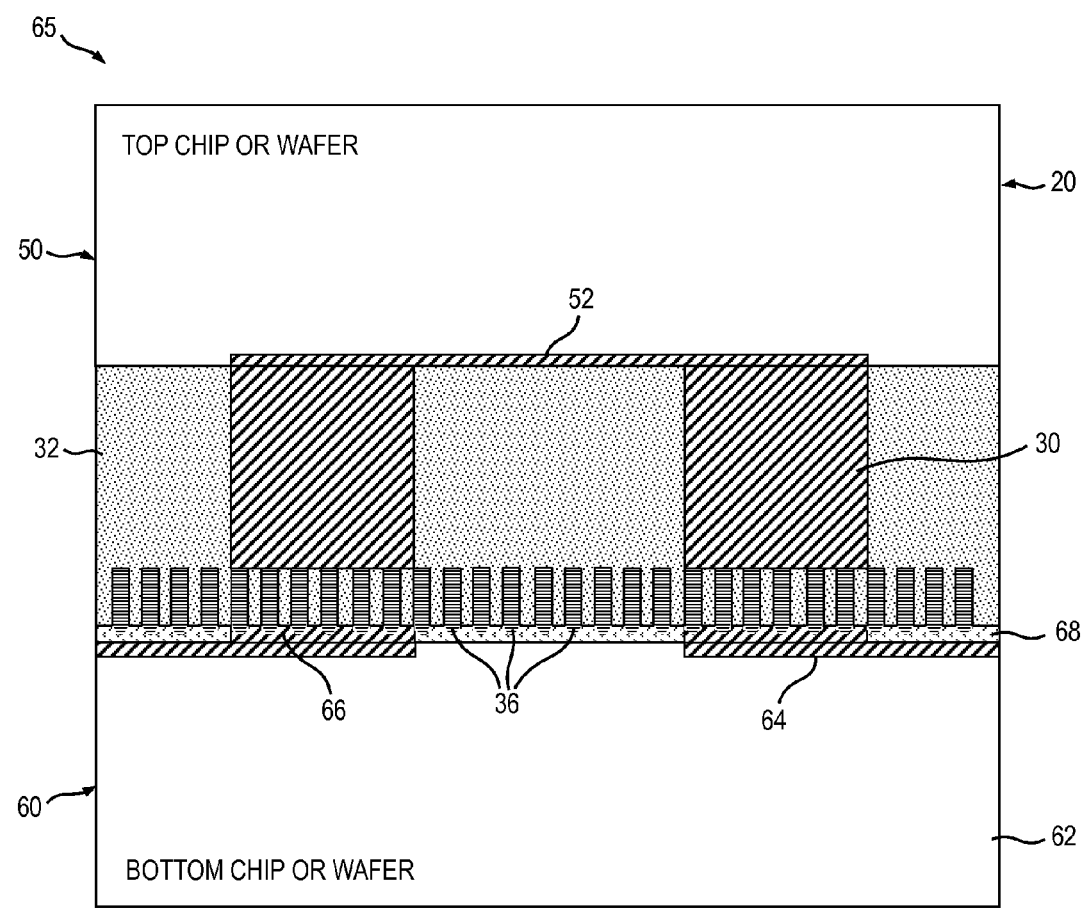
FIG. 6 is an enlarged, sectional view showing the assembly of the two electronic structures shown in FIG. 5.

FIG. 6 schematically illustrates an assembled structure 65 including the top and bottom devices 50, 60 following thermal compression bonding. In an exemplary process, mechanical force is applied to the top device, for example a die, and heat is provided to melt the solder bumps. In embodiments where underfill material overlies contact pads 66, as shown in FIG. 5, sufficient heating is employed to reduce the viscosity of the underfill material so that it can flow outwardly from the areas of contact between the solder bumps 36 and the contact pads 66. Following alignment as shown in FIG. 5, the top structure (e.g. chip) descends until the chip contacts the top surface of the bottom device 60. Force is applied during the heating of one or both of the devices 50, 60, prior to the melting of solder. The material comprising the layer 68, having low viscosity, is displaced away from the areas above the contact pads 66 as pressure is exerted via a mechanical force on the top device 50. Upon melting of the solder, an electrical connection is established between the top and bottom devices as the solder electrically connects the metal pillars 30 of the top device with the contact pads 66 of the bottom device 60. The mechanical force is removed and the required gap between the top and bottom devices is adjusted as necessary while the solder is molten. The assembled structure 65, which comprises an electronic module in one or more embodiments, is then cooled. As the underfill coating layer 32 containing the solder is cured, the solder therein does not collapse or flow laterally in a manner that would lead to electrical shorting. The solder volume in each passage 44 is also too small to cause unwanted electrical shorting. Displacement of underfill material is unnecessary in embodiments where neither the solder bumps nor the contact pads are covered by underfill material. In other exemplary embodiments, compression at 100° C. and mass reflow are employed to effect bonding and the formation of solder joints.

Figure 7:
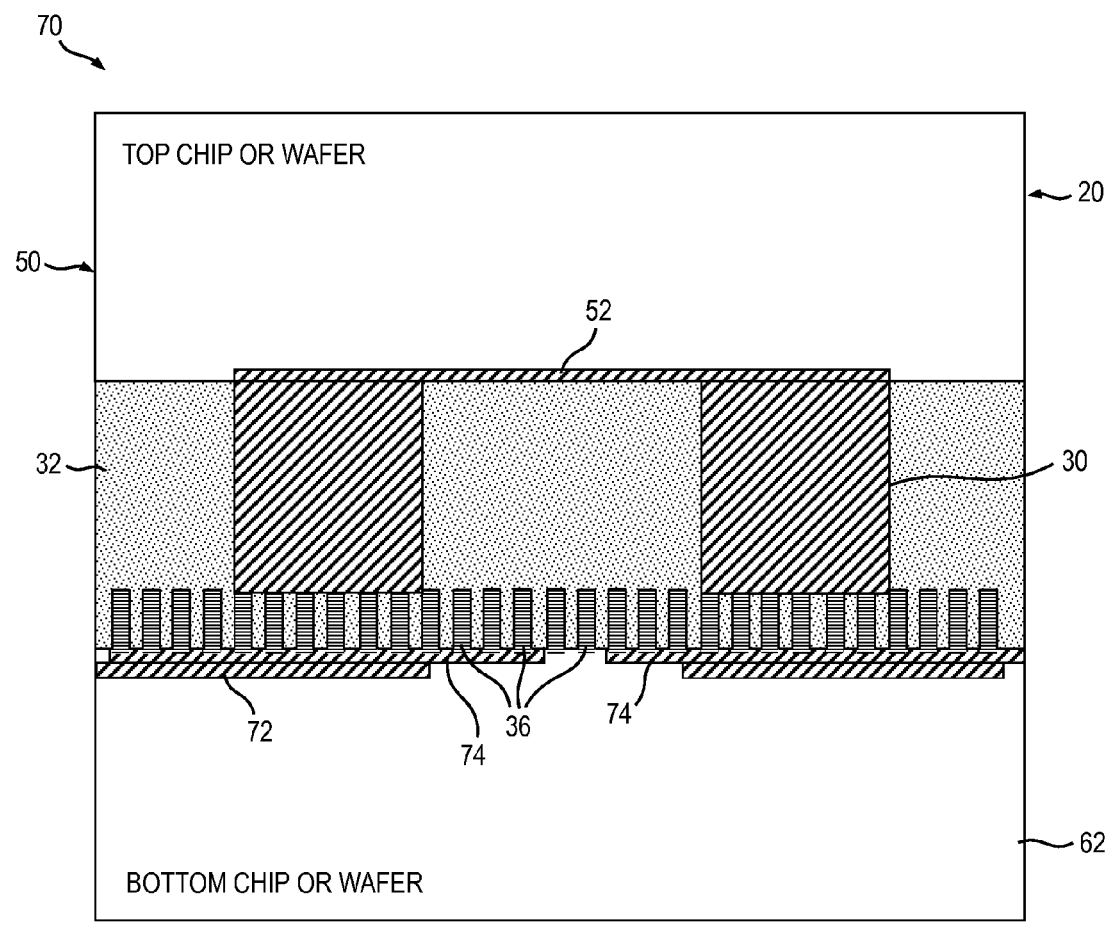
FIG. 7 is an enlarged, sectional view showing the assembly of two alternative electronic structures.

A further exemplary structure 70 is schematically illustrated in FIG. 7. The top device 50 is the same as that shown in FIG. 5. The bottom device includes relatively large contact pads 74 that increase the alignment tolerances of the devices. The contact pads are in electrical contact with metal layer(s) 72 in the bottom device. Unlike the bottom device 60 shown in FIGS. 5 and 6, the contact pads 74 are not covered by an underfill layer. The exemplary structure can accordingly be assembled substantially as described with respect to FIGS. 5 and 6 other than the displacement of such an underfill layer.

Figure 8:
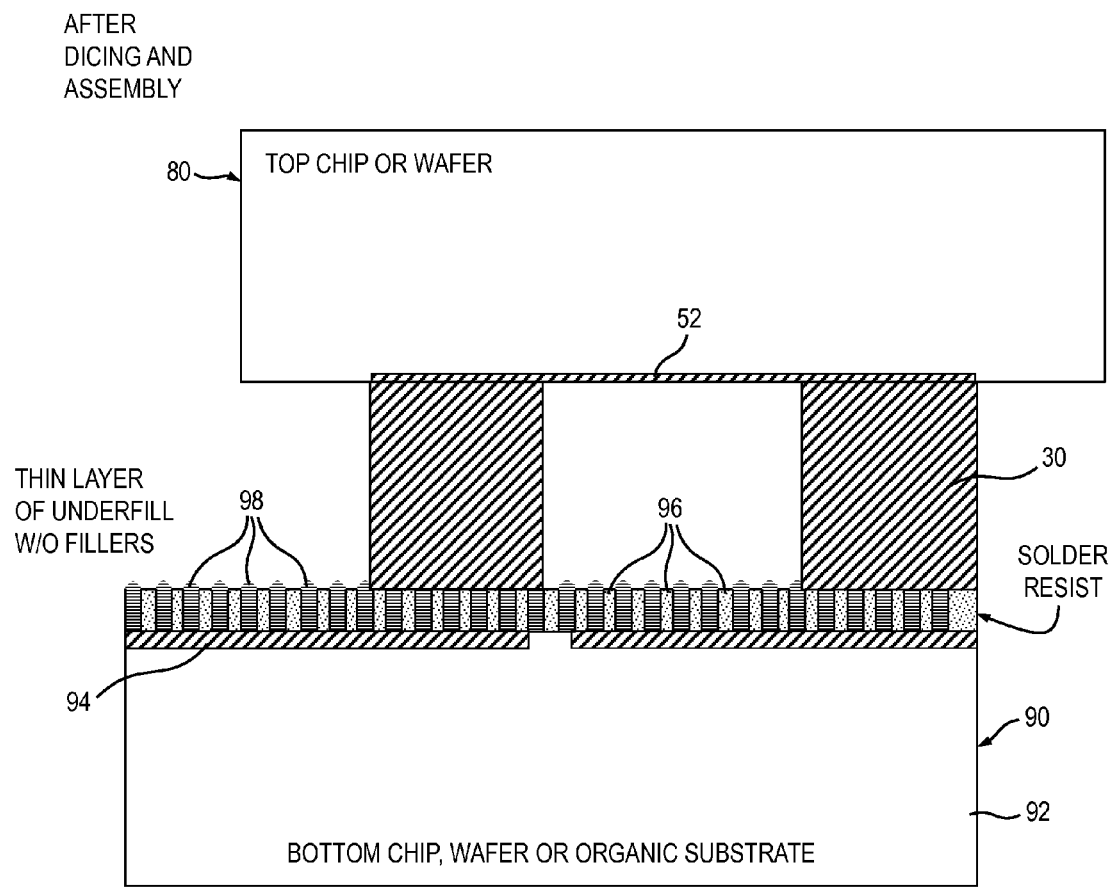
FIG. 8 is an enlarged, sectional view showing a further alternative structure after bonding and prior to underfill.

FIG. 8 illustrates a further alternative structure including top and bottom electronic devices 80, 90. The top device 80, such as a chip or wafer, is obtained in substantially the same manner described above with respect to FIGS. 1A-1F. The bottom device 90 includes a base 92 that may comprise an organic laminate and a plurality of electrically conductive pads 94 formed on the base 92. The pads 94 function as contact structures and are electrically connected to one or more integrated circuits within the base 92 in some embodiments. A thin layer 96 of underfill containing no fillers is on the base. Alternatively, the thin layer 96 is a solder resist layer or a combination of underfill and solder resists layers wherein the solder resist layer adjoins the conductive pads 94 of an organic laminate. Passages are formed in the layer 96 subsequent to curing and prior to positioning of the top device 80 on the bottom device 90. As described above with respect to FIGS. 1H, 2I and 4, laser drilling can be employed to form the passages in the layer 96. The passages, which expose surface portions of the contact pads 94, are subsequently filled with molten solder as described above. Solder structures 98 within the passages contact the metal pillars 30 and the electrically conductive pads 94, providing electrical connections between them. In one or more embodiments, the heights of the metal pillars 30 are more than twice the heights of the solder structures 98. The surface area of each electrically conductive pad greatly exceeds each area of contact between each solder structure 98 and each pad. In one or more embodiments, at least five (5) solder structures 98 contact each electrically conductive pad 94. At least two (2) solder structures 98 contact each metal pillar 30 in one or more embodiments. As discussed above, the passages in which solder is deposited can be formed in the layer 96 of underfill and/or solder resist material by laser drilling. Molten solder can subsequently be injected into the passages. The top and bottom devices 80, 90 are bonded via thermal compression or other suitable process. The space between devices is subsequently filled with underfill material (not shown) containing fillers.

Figure 9:
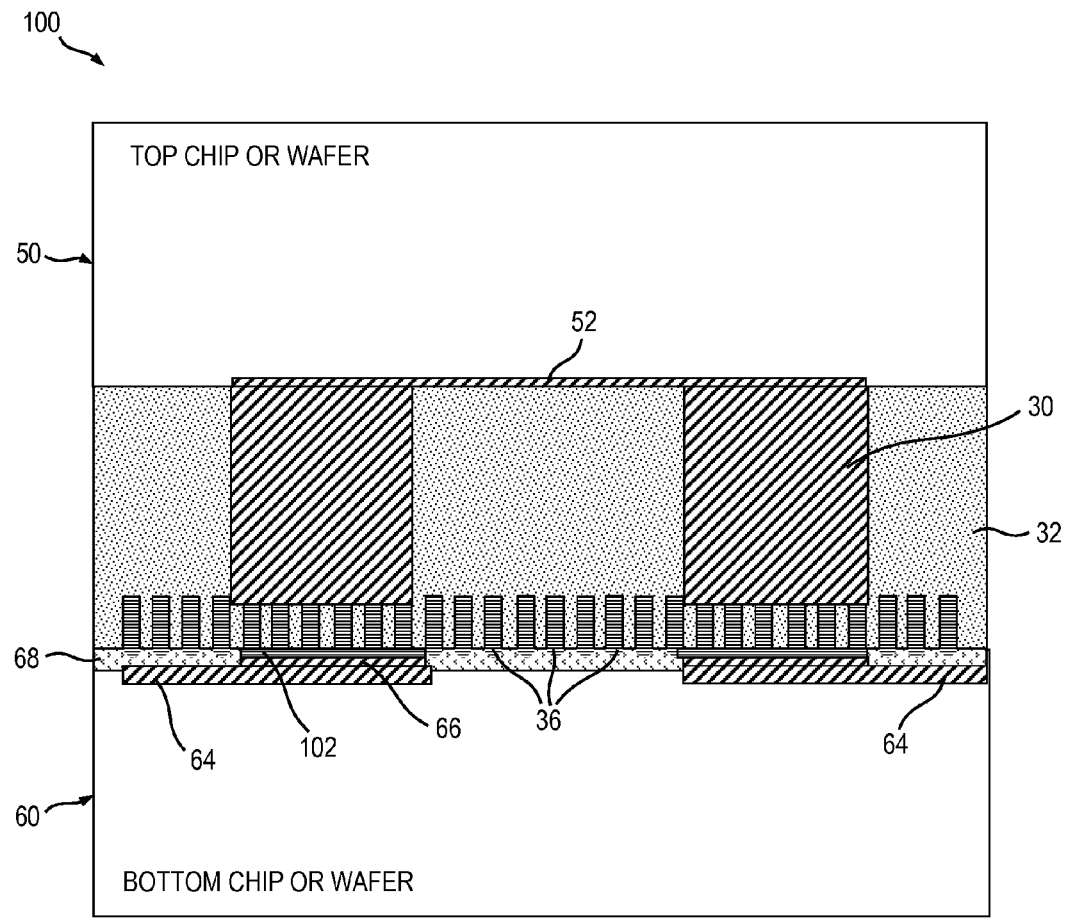
FIG. 9 is an enlarged, sectional view showing a further alternative structure.

FIG. 9 illustrates a further exemplary assembly 100 of top and bottom electronic devices similar to the assembly 65 shown in FIG. 6. The same reference numerals are employed to designate similar elements present in both assemblies. In the assembly 100, the solder bumps 36 are wet to the contact pads 66. In the assembly 65 shown in FIG. 6, the solder bumps 36 touch the contact pads 66, but are not connected. An intermetallic layer 102 is formed on the contact pads 66 by the solder bumps 36 of the assembly 100, connecting the solder bumps that are aligned with the contact pads. The solder bumps aligned with the underfill layer 68 remain unconnected as the solder only wets on the contact pads 66. The top and bottom devices 50, 60 can be subjected to thermal compression bonding or compression at 100° C. and mass reflow to obtain the assembly 100 (e.g. an electronic module) shown in FIG. 9. The contact pads 66 should be substantially oxide-free to facilitate wetting. In some embodiments, the solder bumps 36 are comprised of tin-based, lead-free materials and the contact pads are copper. An exemplary intermetallic layer in such embodiments includes $Cu_6Sn_5$ and $Cu_3Sn$. In other exemplary embodiments wherein the contact pads are nickel, a $Ni_3Sn_4$ intermetallic layer 102 is formed.

Given the discussion thus far and with reference to the exemplary embodiments discussed above and the drawings, it will be appreciated that, in general terms, an exemplary electronic device is provided that includes a wafer, a plurality of metal pillars 30 mounted to the wafer, each of the metal pillars having a top surface, an underfill coating 32 on the wafer and encapsulating the metal pillars, the underfill coating having a contact surface, and a plurality of passages extending within the underfill coating from the contact surface thereof to the top surfaces of the metal pillars. Each of the passages is filled with solder structures 36, the height of each metal pillar being at least equal to the height of each solder structure in contact therewith. The top surface of each metal pillar contacts a plurality of the solder structures. Each of the solder structures includes an exposed end portion. FIGS. 1I and 2J schematically illustrate exemplary devices. In some embodiments, the top surface of each metal pillar 30 contacts at least ten solder structures 36. Each metal pillar 30 has a diameter at least five times greater than the diameters of each of the solder structures 36 in contact therewith in some embodiments, as shown in FIG. 3. Each metal pillar may further have a height that is at least twice the height of each solder structure in contact therewith. In one or more embodiments, each solder structure 36 contacts the top surface of each metal pillar 30 in a contact area, the top surface of each metal pillar 30 having a surface area at least twenty-five times greater than each contact area. In some embodiments, the underfill coating includes a first layer 32 containing filler material and a second layer 40 adjoining the first layer, the second layer of underfill coating having a substantially lower filler material content than the first layer, the plurality of passages 44 extending through the second layer 40 of the underfill coating. In other embodiments, the second layer 40 comprises solder resist material. An exemplary embodiment of a device including first and second underfill layers is described above with respect to FIGS. 2J and 4. In some embodiments, the device further includes an electronic assembly 60 comprising a plurality of electrically conductive contact pads 66, each of the metal pillars 30 being electrically connected to one of the contact pads by a plurality of the solder structures 36. Exemplary structures are shown in FIGS. 6, 7 and 9. Further exemplary devices provided in accordance with the principles of the disclosure, such as the electronic device 90 and its assembly with a top chip or wafer, are described above with respect to FIG. 8.

An exemplary method includes obtaining a structure including a wafer 20 and a plurality metal contact structures such as metal pillars 30 or electrically conductive contact pads 94 mounted to the wafer, each of the metal contact structures having a top surface. A coating comprising at least one of underfill material and solder resist 32, 40, 96 is deposited on the wafer, thereby encapsulating the metal contact structures, such as shown in FIGS. 1G and 2H. Passages are formed through the coating such that a plurality of portions of the top surface of each metal contact structure are exposed, respectively, by a plurality of the passages 34 and 44, such as shown in FIGS. 1H and 2I, respectively Each of the passages is filled with molten solder, the molten solder forming solder structures 36 (98 in FIG. 8) contacting the exposed portions of the top surfaces of each metal contact structure 30, 94. Exemplary electronic devices including solder structures are shown in FIGS. 3 and 4. In some embodiments wherein the metal contact structures are metal pillars, the height of each metal pillar is at least twice the height of each solder structure in contact with the top surface thereof in one or more exemplary embodiments. In further embodiments, each metal pillar 30 has a diameter at least five times greater than the diameters of each of the solder structures 36 in contact with the top surface thereof. In some embodiments, an underfill coating is deposited in two layers as shown in FIGS. 2G and 2H, a first layer 32 containing filler material and a second layer 40 adjoining the first layer, the second layer of underfill coating having a substantially lower filler material content (and possibly no filler material content) than the first layer, the plurality of passages 44 extending through the second layer of the underfill coating. The electronic device formed by one or more of the exemplary methods is bonded to a second electronic device. By applying and curing the underfill coating before bonding the second electronic device, typical CPI stresses can be reduced.

A further exemplary method includes providing a first electronic device including a plurality of metal pillars and a second electronic device including a plurality of electrically conductive contact pads. One of the first and second electronic devices includes a cured coating comprising at least one of underfill material and solder resist, a plurality of passages extending through the coating, and a plurality of solder structures. Each of the solder structures fills one of the passages. The heights of the metal pillars are at least equal to the heights of the solder structures. The method further includes causing the first electronic device to contact the second electronic device such that the metal pillars are in opposing relation to the electrically conductive pads and a plurality of the solder structures extend between each metal pillar and each electrically conductive pad and bonding the first electronic device and the second electronic device such that each of the metal pillars is electrically connected to one of the opposing electrically conductive pads by a plurality of solder structures. In some embodiments, the method further includes the steps of forming and curing an underfill coating on the first electronic device, forming the passages extending through the underfill coating 32 or 40, and filling the passages with solder prior to bonding the first and second electronic devices. In other embodiments, such as described above with respect to FIG. 8, the method further includes the steps of forming and curing the solder resist and/or underfill coating 96 on the second electronic device 90, forming the passages extending through the coating to the contact pads 94, and filling the passages with solder prior to bonding the first and second electronic devices.

Those skilled in the art will appreciate that the exemplary structures discussed above can be distributed in raw form or incorporated as parts of intermediate products or end products that benefit from the application of flip chip technology.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below", "top" and "bottom" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
   obtaining a structure including a wafer and a plurality of metal contact structures including metal pillars mounted to the wafer, each of the metal pillars having a top surface;
   depositing a coating comprising underfill material containing filler material on the wafer, thereby encapsulating the metal pillars;
   curing the coating on the wafer;
   forming a plurality of passages through the coating such that a plurality of portions of the top surface of each metal pillar are exposed, respectively, by a plurality of the passages, and
   filling each of the passages with molten solder, the molten solder forming solder structures contacting the exposed portions of the top surfaces of each metal pillar.

2. The method of claim 1, wherein forming the plurality of passages includes laser drilling through the coating.

3. The method of claim 1, wherein the height of each metal pillar is at least equal to the height of each solder structure in contact with the top surface thereof, and the underfill material comprises a thermosetting polymer and the filler material includes silica, alumina, graphene, graphene oxide, graphite or boron nitride.

4. The method of claim 3, wherein each metal pillar has a diameter at least five times greater than the diameters of each of the solder structures in contact with the top surface thereof and a height greater than the heights of each of the solder structures in contact with the top surface thereof.

5. The method of claim 3, further including forming the passages such that at least ten portions of the top surface of each metal pillar are exposed.

6. The method of claim 3, wherein the step of depositing the coating includes depositing a first underfill layer containing the filler material and a second underfill layer adjoining the first underfill layer, the second underfill layer having a substantially lower filler material content than the first underfill layer, the plurality of passages being formed through the second underfill layer.

7. The method of claim 1, further including providing an electronic assembly comprising a plurality of electrically conductive contact pads and electrically connecting one or more of the metal pillars to one or more of the contact pads via the solder structures by reflowing the solder structures within the passages, each electrical connection of one of the metal pillars with one of the contact pads including a plurality of the solder structures.

8. A method comprising:
providing a first electronic device including a plurality of metal pillars;
providing a second electronic device including a plurality of electrically conductive contact pads, one of the first and second electronic devices including a cured coating comprising at least one of underfill material and solder resist, a plurality of passages extending through the coating, and a plurality of solder structures, each of the solder structures filling one of the passages, the heights of the metal pillars being at least equal to the heights of the solder structures;
causing the first electronic device to contact the second electronic device such that the metal pillars are in opposing relation to the electrically conductive pads and a plurality of the solder structures extend between each metal pillar and each electrically conductive pad, and
bonding the first electronic device and the second electronic device by reflowing the solder structures within the passages such that each of the metal pillars is electrically connected to one of the opposing electrically conductive pads by a plurality of the solder structures.

9. The method of claim 8, wherein each metal pillar has a diameter at least five times greater than the diameters of each of the solder structures electrically connected thereto and a height greater than the heights of each of the solder structures electrically connected thereto.

10. The method of claim 8, wherein the coating includes an underfill coating layer containing filler material, further including the steps of forming and curing the underfill coating layer on the first electronic device and encapsulating the metal pillars, forming the passages through the underfill coating layer such that some of the passages expose top surfaces of the metal pillars and others of the passages are located between metal pillars, and filling the passages with solder prior to bonding the first and second electronic devices.

11. The method of claim 8, wherein the coating includes a cured underfill first layer on the first device containing filler material and a second polymer layer adjoining the first layer, the metal pillars extending through the first layer, the plurality of passages extending through the second layer, the solder structures within the passages electrically contacting the metal pillars.

12. The method of claim 8, further including the steps of forming and curing the coating on the second electronic device, forming the passages extending through the coating to the contact pads, and filling the passages with solder prior to bonding the first and second electronic devices.

\* \* \* \* \*